United States Patent
Gu et al.

(10) Patent No.: US 11,569,282 B2
(45) Date of Patent: Jan. 31, 2023

(54) IMAGE SENSOR PACKAGE INCLUDING BONDING WIRE INSIDE SUPPORT MEMBER

(71) Applicant: Samsung Electro-Mechanics Co., Ltd., Suwon-si (KR)

(72) Inventors: Won Seo Gu, Suwon-si (KR); Sang Jin Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 264 days.

(21) Appl. No.: 16/826,481

(22) Filed: Mar. 23, 2020

(65) Prior Publication Data

US 2021/0074750 A1   Mar. 11, 2021

(30) Foreign Application Priority Data

Sep. 11, 2019   (KR) .................. 10-2019-0112556

(51) Int. Cl.
*H01L 27/146*   (2006.01)
*H04N 5/225*   (2006.01)

(52) U.S. Cl.
CPC .. *H01L 27/14618* (2013.01); *H01L 27/14627* (2013.01); *H01L 27/14636* (2013.01); *H04N 5/2252* (2013.01); *H04N 5/2253* (2013.01); *H04N 5/2254* (2013.01)

(58) Field of Classification Search
CPC ............ H01L 27/146; H01L 27/14601; H01L 27/14618; H01L 27/14621; H01L 27/14625; H01L 27/14627; H01L 27/14636; H04N 5/2251; H04N 5/2252; H04N 5/2253; H04N 5/2254
See application file for complete search history.

(56) References Cited

U.S. PATENT DOCUMENTS

| | | | |
|---|---|---|---|
| 2009/0045476 A1 | 2/2009 | Peng et al. | |
| 2018/0012919 A1* | 1/2018 | Tu | H01L 27/14618 |
| 2019/0007431 A1 | 3/2019 | Chuang et al. | |
| 2019/0165019 A1* | 5/2019 | Wang | H01L 24/48 |
| 2019/0174087 A1 | 6/2019 | Kim et al. | |
| 2020/0007726 A1 | 1/2020 | Wang et al. | |
| 2020/0119070 A1* | 4/2020 | Yang | H01L 27/14618 |

(Continued)

FOREIGN PATENT DOCUMENTS

| | | | | |
|---|---|---|---|---|
| CN | 101369543 A | | 2/2009 | |
| CN | 102117817 A | * | 7/2011 | ............. H01L 24/32 |
| CN | 102117817 A | | 7/2011 | |

(Continued)

OTHER PUBLICATIONS

Chinese Office Action dated May 6, 2022, in counterpart Chinese Patent Application No. 202010431073.1 (8 pages in English and 8 pages in Chinese).

*Primary Examiner* — John P. Dulka
(74) *Attorney, Agent, or Firm* — NSIP Law

(57) ABSTRACT

An image sensor package includes a substrate connected to an image sensor by a bonding wire; a sub-housing disposed adjacent to an upper surface of the substrate so as to surround the bonding wire; and a support member disposed at least partially in a space between the sub-housing and the substrate to limit elastic deformation of the sub-housing, and a portion of the bonding wire is disposed inside the support member.

12 Claims, 3 Drawing Sheets

(56) References Cited

U.S. PATENT DOCUMENTS

2021/0313367 A1* 10/2021 Hatano ................. H04N 5/369

FOREIGN PATENT DOCUMENTS

| CN | 103383514 A | 11/2013 |
| CN | 103928481 A | 7/2014 |
| CN | 108401093 A | 8/2018 |
| CN | 109427829 A | 3/2019 |
| DE | 20 2005 019 704 U1 | 4/2006 |
| KR | 10-1901709 B1 | 9/2018 |
| KR | 10-2018-0132684 A | 12/2018 |

* cited by examiner

IMAGE SENSOR PACKAGE INCLUDING BONDING WIRE INSIDE SUPPORT MEMBER

CROSS-REFERENCE TO RELATED APPLICATION(S)

This application claims the benefit under 35 USC 119(a) of Korean Patent Application No. 10-2019-0112556 filed on Sep. 11, 2019, in the Korean Intellectual Property Office, the entire disclosure of which is incorporated herein by reference for all purposes.

BACKGROUND

1. Field

The following description relates to an image sensor package.

2. Description of Background

Camera modules have been applied to various IT devices such as portable electronic devices, and the like.

Such a camera module includes a lens module and a housing accommodating the lens module, and a substrate on which an image sensor is installed is coupled to a lower portion of the housing. The image sensor is electrically connected to the substrate by a bonding wire.

There has been demand for miniaturization of the camera module itself due to miniaturization of portable electronic devices.

As the camera modules are miniaturized as described above, a size of a space in which the bonding wire is provided is also reduced. Accordingly, when an external impact or the like occurs, an internal component of the camera module may interfere with the bonding wire, thereby giving rise to a problem of a broken bonding wire.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

An image sensor package satisfying demand for miniaturization while securing reliability against external impacts, or the like.

In one general aspect, an image sensor package includes a substrate connected to an image sensor by a bonding wire; a sub-housing disposed adjacent to an upper surface of the substrate so as to surround the bonding wire; and a support member disposed at least partially in a space between the sub-housing and the substrate to limit elastic deformation of the sub-housing, and a portion of the bonding wire is disposed inside the support member.

A length of the bonding wire from one end of the bonding wire connected to the substrate to a vertex of the bonding wire may be disposed inside the support member.

An upper surface of the support member may be in contact with the sub-housing, and a lower surface of the support member may be in contact with the substrate.

An inner side surface of the support member may be an inclined surface.

The inner side may have an inner diameter that increases from a lower side to an upper side in an optical axis direction.

The image sensor package may include a filter attached to the sub-housing.

The sub-housing may include a step portion an upper surface, and the filter may be attached to the step portion.

The substrate may define an accommodation space that accommodates the image sensor.

The accommodation space may be a hole that passes through the substrate.

The image sensor package may include a reinforcing board coupled to the substrate so as to cover the accommodation space.

The image sensor may be in contact with the reinforcing board.

The image sensor package may be included in a camera module that includes a lens module coupled to an object side of the image sensor package.

A first end of the bonding wire may be attached to an upper surface of the image sensor and a second end of the bonding wire may be attached to the upper surface of the substrate, and the upper surface of the image sensor and the upper surface of the substrate may not be coplanar.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
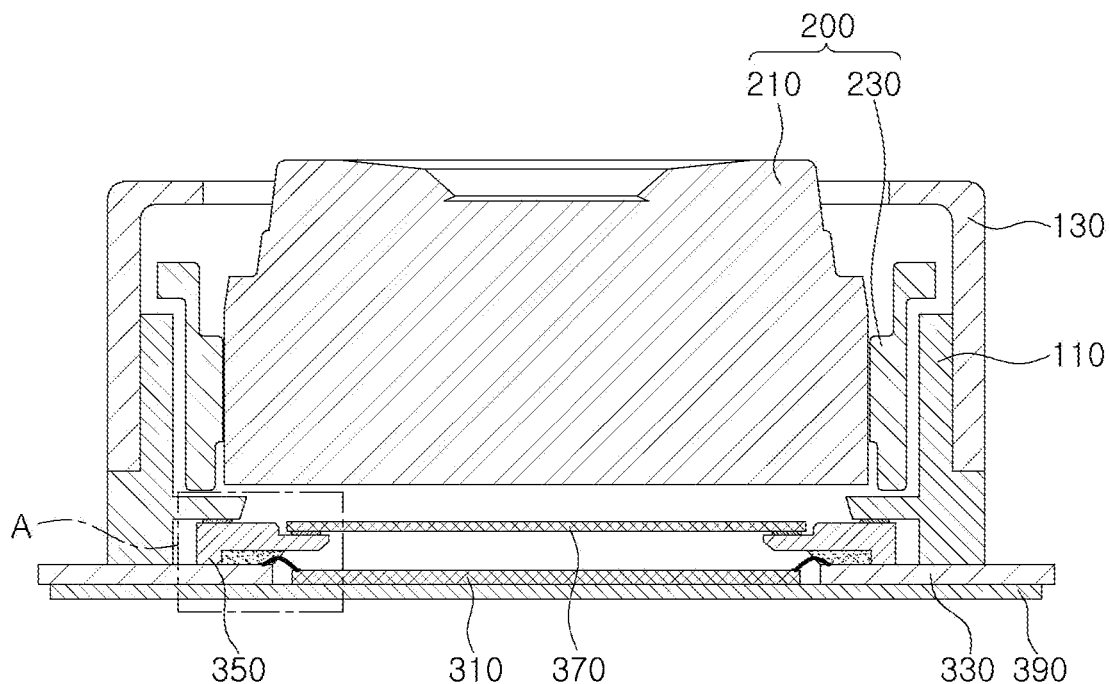
FIG. 1 is a schematic cross-sectional view of a camera module according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
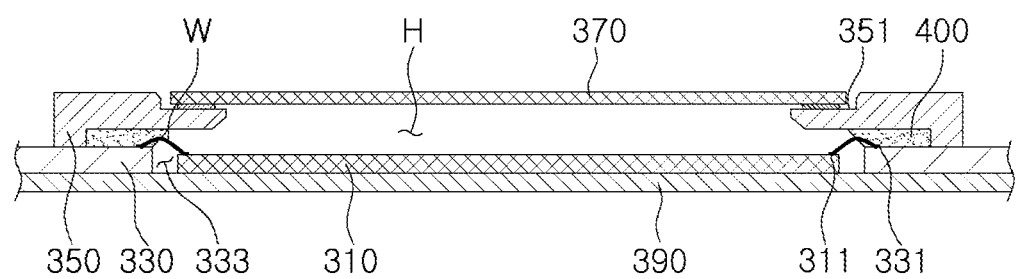
FIG. 2 is a schematic cross-sectional view of an image sensor package according to an example.
Figure 3:
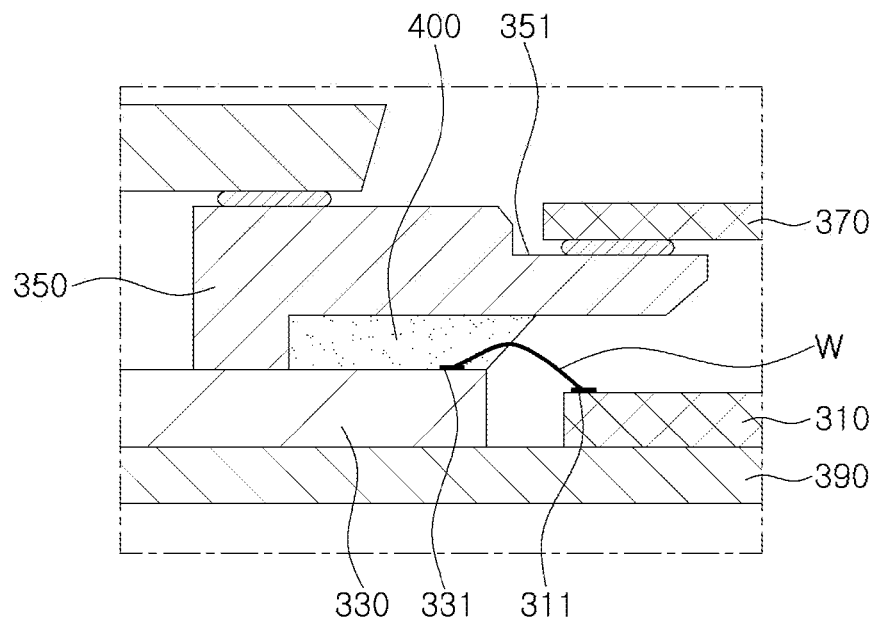
FIG. 3 is an enlarged view of "A" of FIG. 1.

FIG. 1 is a schematic cross-sectional view of a camera module according to an example. FIG. 2 is a schematic cross-sectional view of an image sensor package according to an example, while FIG. 3 is an enlarged view of "A" of FIG. 1.

Referring to FIGS. 1 and 2, a camera module includes a lens module 200, a housing 110, a case 130 and an image sensor package 300.

The lens module 200 may include a lens barrel 210 and a lens holder 230.

The lens barrel 210 may be accommodated with at least one lens capturing a subject. When a plurality of lenses is disposed, a plurality of lenses is disposed inside the lens barrel 210 along an optical axis. The lens barrel 210 may have a hollow cylindrical shape and is coupled to the lens holder 230.

The housing 110 accommodates the lens module 200, and may include an actuator (not illustrated) moving the lens module 200 in an optical axis direction and/or a direction perpendicular to the optical axis.

The image sensor package 300 may be disposed in a lower portion of the housing 110. For example, the housing 110 may be coupled with a printed circuit board 330 so as to surround a sub-housing 350.

The case 130 is coupled to the housing 110 so as to cover an outer surface of the housing 110 and serves to protect internal components of the camera module.

The image sensor package 300 is a device converting light incident through the lens module into an electric signal.

As an example, the image sensor package 300 includes the printed circuit board 330 (hereinafter, "substrate"), an image sensor 310, the sub-housing 350 and an infrared cut filter 370 (hereinafter, "filter").

FIG. 2 is a schematic cross-sectional view of an image sensor package according to an example.

Referring to FIG. 2, the image sensor package 300 includes the substrate 330, the image sensor 310, the sub-housing 350, and the filter 370.

The image sensor 310 may convert light incident through the lens module 200 into an electrical signal. As an example, the image sensor 310 may be a charge coupled device (CCD) or a complementary metal-oxide semiconductor (CMOS).

The electrical signal converted by the image sensor 310 may be output as an image through a display unit of a portable electronic device.

The image sensor 310 is electrically connected to the substrate 330 through a bonding wire W.

Bonding pads 311 and 331 are provided in the image sensor 310 and the substrate 330, respectively. The boding wire W is coupled to the bonding pads 311 and 331 to electrically connect the image sensor 310 to the substrate 330.

The substrate 330 is provided with an accommodation space 333 in which the image sensor 310 is accommodated. The accommodation space 333 may be in the form of a hole passing through the substrate 330.

The image sensor 310 is inserted into the accommodation space 333 of the substrate 330. An upper surface of the image sensor 310 may be located on a level lower than an upper surface of the substrate 330.

As the image sensor 310 is inserted into the accommodation space 333 of the substrate 330, an overall height of the camera module may be reduced by as much as a height of the image sensor 310, compared to a case in which the image sensor 310 is built in the upper surface of the substrate 330.

As the accommodation space 333 having a hole shape is provided in the substrate 330, rigidity of the substrate 330 may be deteriorated, and accordingly, the substrate 330 and the image sensor 310 are likely to break.

An image sensor package 300 according to an example includes a reinforcing board 390 to reinforce the rigidity of the substrate 330.

The reinforcing board 390 may be formed of a metal and is coupled to a lower portion of the substrate 330. As an example, the reinforcing board 390 may be linked to the lower portion of the substrate 330 so as to cover the accommodation space 333 of the substrate 330.

Accordingly, as the rigidity of the substrate 330 is compensated by the reinforcing board 390 even when the hole-shaped accommodation space 333 is provided in the substrate 330, the substrate 330 and the image sensor 310 may be prevented from being broken when manufactured and utilized.

A thickness of the reinforcing board 390 may be smaller than a thickness of the substrate 330.

Heat may be generated in the image sensor 310 during use of the camera module. Due to such heat, resolution may be degraded, and noise may occur in captured images.

An image sensor package 300 according to an example is configured to easily release heat generated in the image sensor 310.

As an example, the image sensor 310, while being inserted into the accommodation space 333, is configured to be in contact with the reinforcing board 390.

As the reinforcing board 390 is formed of a substance capable of thermal conduction (for example, a metal), the heat generated in the image sensor 310 may be released to the outside through the reinforcing board 390.

As previously discussed, heights of the image sensor package 300 and camera module may be reduced by inserting the image sensor 310 into the accommodation space 333 of the substrate 330. The rigidity of the substrate 330 may be compensated by the reinforcing board 390. Further, by allowing the image sensor 310 to be in contact with the reinforcing board 390 formed of a metal, the heat generated in the image sensor 310 may be easily discharged to the outside.

The sub-housing 350 is coupled to the substrate 330. As an example, the sub-housing 350 is provided in an upper portion of the substrate 330 so as to surround the bonding wire W and the bonding pad 331 provided on the substrate 330. In addition, the sub-housing 350 may include a hole H exposing the image sensor 310.

The filter 370 is accommodated in the sub-housing 350. The filter 370 serves to block light in an infrared region from light incident through the lens module 200.

The sub-housing 350 is provided with a step portion 351 on the upper surface thereof, and the filter 370 may be built in the step portion 351. As the filter 370 is built in the step portion 351 of the sub-housing 350, a height of the camera module and the image sensor package 300 may be reduced by an amount equal to a height of the filter 370.

A space in which the bonding wire W is disposed is provided between the sub-housing 350 and the substrate 330.

At least a portion of the sub-housing 350 may be elastically deformed when an external impact, or the like, is applied. Accordingly, the external impact may be delivered to the bonding wire W as the sub-housing 350 and the bonding wire W are in contact with each other. This may lead to breakage of the bonding wire W.

As shown in FIGS. 2 and 3, the image sensor package 300 is provided with a support member 400 in a space in which the bonding wire W is disposed so as to prevent the sub-housing 350 from being in contact with the bonding wire W.

An upper surface of the support member 400 is in contact with the sub-housing 350, while a lower surface of the support member 400 is in contact with the substrate 330. A portion of the bonding wire W is disposed inside the support member 400. As an example, a portion of the bonding wire W is inserted into the support member 400 while the remaining portion is exposed externally of the support member 400

One side/end of the bonding wire W is connected to the bonding pad 331 of the substrate 330 and the other side/end of the bonding wire W is connected to the bonding pad 311 of the image sensor 310. The bonding wire W may be disposed in a curved form.

A portion of the bonding wire W is disposed inside the support member 400. As an example, an area from one side/end of the bonding wire W to a vertex of the bonding wire W may be disposed inside the support member 400. The vertex of the bonding wire W may be a portion located uppermost in an optical axis direction in the bonding wire W in a curved form.

An inner side surface of the support member 400 may include an inclined surface. As an example, the inner side surface of the support member 400 may have an inner diameter increasing from a lower side of the optical axis direction to an upper side.

The support member 400 may be formed of an epoxy, and is present in a gel form in a certain temperature range while being present in a solidified form in another certain temperature range.

After the bonding wire W is installed so as to connect the substrate 330 and the image sensor 310, the support member 400 is disposed so as to cover a portion of the bonding wire W and the bonding pad 331 of the substrate 330. As the support member 400 is in a gel form, a portion of the bonding wire W may be inserted inside the support member 400.

The sub-housing 350 is then coupled to the substrate 330 so that the support member 400 is compressed, and by solidifying the support member 400, the image sensor package 300 can be manufactured.

As a portion of the space between the sub-housing 350 and the substrate 330, a space in which the bonding wire W is disposed, is filled with the support member 400, the sub-housing 350 can be prevented from being in contact with the bonding wire W even when an external impact, or the like, is applied thereto. Accordingly, the bonding wire W can be prevented from being broken.

That is, despite an external impact, the elastic deformation of the sub-housing 350 can be limited, thereby preventing interference between the sub-housing 350 and the bonding wire W.

Further, as a portion of the bonding wire W is inserted inside the support member 400, the bonding wire W can be protected by the support member 400. In this regard, the external impact, or the like, is not directly delivered to the bonding wire W, thereby preventing the bonding wire W from being cut or broken.

Also, foreign substances that may occur in the bonding wire W may be prevented from penetrating into the image sensor 310 by the support member 400.

The support member 400 may be in a color absorbing light. The support member 400 may be in a color, for example, black, having low reflectivity.

Accordingly, colors undesired by the camera module may be prevented from being reflected by the support member 400 and incident to the image sensor 310.

When light unnecessary for formation of an image is incident to the image sensor 310, flare, or the like, may occur. The image sensor package according to an example, however, can prevent unnecessary light from being incident to the image sensor 310 by the support member 400 disposed around the image sensor 310.

Figure 4:
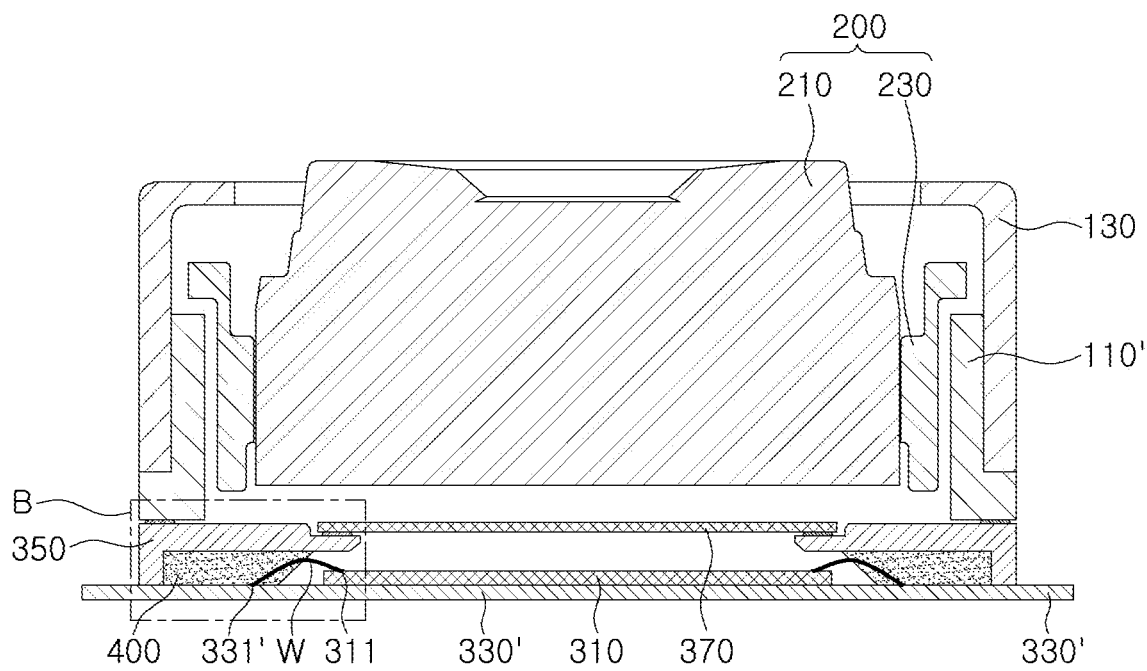
FIG. 4 is a schematic cross-sectional view of an image sensor package according to an example.
Figure 5:
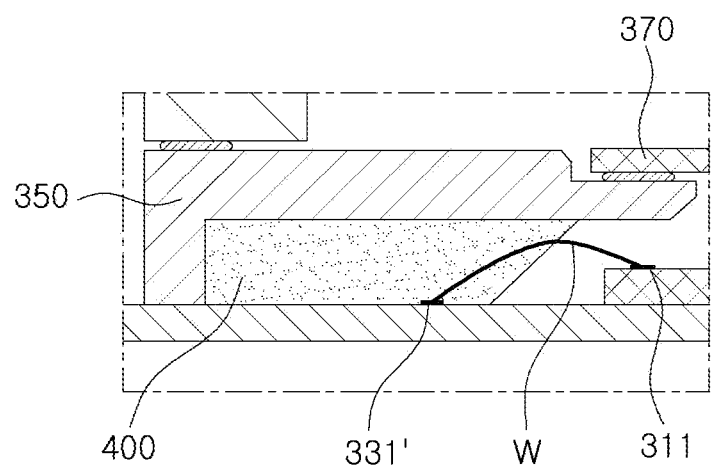
FIG. 5 is an enlarged view of "B" of FIG. 4.

FIG. 4 is a schematic cross-sectional view of an image sensor package according to an example, and FIG. 5 is an enlarged view of "B" of FIG. 4.

As shown in FIGS. 4 and 5, an image sensor package of a camera module includes a substrate 330', an image sensor 310, a sub-housing 350 and a filter 370.

The image sensor 310 may be disposed on an upper surface of the substrate 330' and may be electrically connected to the substrate 330' via a bonding wire W.

Bonding pads 311 and 331' are provided in the image sensor 310 and the substrate 330', respectively. The boding wire W is coupled to the bonding pads 311 and 331' to electrically connect the image sensor 310 to the substrate 330'.

The sub-housing 350 is coupled to the substrate 330'. As an example, the sub-housing 350 is connected to the substrate 330' so as to surround the bonding pad 331' provided on the substrate 330'. A housing 110' of the camera module may be coupled to an upper surface of the sub-housing 350.

As the examples illustrated in FIGS. 1 through 3, those illustrated in FIGS. 4 and 5 include a support member 400 in a space in which the bonding wire W is disposed.

Through the above examples, an image sensor package may satisfy demand for miniaturization and secure reliability against external impacts, or the like.

As set forth above, according to various examples, an image sensor package can secure reliability against external impacts, and the like, and satisfy demand for miniaturization.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An image sensor package comprising:
a substrate connected to an image sensor by a bonding wire;
a sub-housing disposed in contact with an upper surface of the substrate so as to surround the bonding wire; and
a support member disposed at least partially in a space between the sub-housing and the substrate to limit elastic deformation of the sub-housing,
wherein a portion of the bonding wire is disposed inside the support member and a remaining portion of the bonding wire is disposed outside the support member,
the substrate comprises an accommodation space accommodating the image sensor, and
an upper surface of the support member is in contact with the sub-housing, and a lower surface of the support member is in contact with the upper surface of the substrate.

2. The image sensor package of claim 1, wherein a length of the bonding wire from one end of the bonding wire connected to the substrate to a vertex of the bonding wire is disposed inside the support member.

3. The image sensor package of claim 1, further comprising a filter attached to the sub-housing.

4. The image sensor package of claim 3, wherein an upper surface of the sub-housing comprises a step portion, and the filter is attached to the step portion.

5. The image sensor package of claim 1, wherein the accommodation space is a hole that passes through the substrate.

6. The image sensor package of claim 5, further comprising a reinforcing board coupled to the substrate so as to cover the accommodation space.

7. The image sensor package of claim 6, wherein the image sensor is in contact with the reinforcing board.

8. The image sensor package of claim 1, wherein a first end of the bonding wire is attached to an upper surface of the image sensor, and a second end of the bonding wire is attached to the upper surface of the substrate, and
the upper surface of the image sensor and the upper surface of the substrate are not coplanar.

9. The image sensor package of claim 1, wherein a shortest distance between an upper surface of the image sensor and a plane containing a lower surface of the substrate is less than a shortest distance between the upper surface of the substrate and the plane containing the lower surface of the substrate.

10. An image sensor package comprising:
a substrate connecting to an image sensor by a bonding wire;
a sub-housing disposed in contact with an upper surface of the substrate so as to surround the bonding wire; and
a support member disposed at least partially in a space between the sub-housing and the substrate to limit elastic deformation of the sub-housing,
wherein a portion of the bonding wire is disposed inside the support member,
the substrate comprises an accommodation space accommodating the image sensor, and
an upper surface of the support member, is in contact with the sub-housing and a lower surface of the support member is in contact with the upper surface of the substrate,
wherein an inner side surface of the support member comprises an inclined surface.

11. The image sensor package of claim 10, wherein the inner side surface of the support member has an inner diameter that increases continuously from the upper surface of the support member to the lower surface of the support member.

12. A camera module comprising:
an image sensor package comprising:
a substrate connected to an image sensor by a bonding wire;

a sub-housing disposed in contact with an upper surface of the substrate so as to surround the bonding wire; and a support member disposed at least partially in a space between the sub-housing and the substrate to limit elastic deformation of the sub-housing; and a lens module coupled to an object side of the image sensor package, wherein a portion of the bonding wire is disposed inside the support member, the substrate comprises an accommodation space accommodating the image sensor, and an upper surface of the support member is in contact with the sub-housing, and a lower surface of the support member is in contact with the upper surface of the substrate.

\* \* \* \* \*